(12) United States Patent
Luff et al.

(10) Patent No.: US 7,027,792 B1
(45) Date of Patent: Apr. 11, 2006

(54) TOPOLOGY FOR A SINGLE ENDED INPUT DUAL BALANCED MIXER

(75) Inventors: Gwilym Francis Luff, Great Shelford (GB); Selcuk Sen, Sunnyvale, CA (US)

(73) Assignee: Micro Linear Corporation, San Jose, CA (US)

( * ) Notice: Subject to any disclaimer, the term of this patent is extended or adjusted under 35 U.S.C. 154(b) by 914 days.

(21) Appl. No.: 09/721,528

(22) Filed: Nov. 22, 2000

Related U.S. Application Data

(60) Provisional application No. 60/167,188, filed on Nov. 23, 1999.

(51) Int. Cl.
  *H04B 1/26* (2006.01)

(52) U.S. Cl. .............. 455/314; 455/334; 455/296; 455/326; 327/113

(58) Field of Classification Search ........... 455/313, 455/323, 333, 326, 315, 296, 334, 314; 327/113, 327/355–359, 119
See application file for complete search history.

(56) References Cited

U.S. PATENT DOCUMENTS

| | | | |
|---|---|---|---|
| 3,988,606 A | 10/1976 | Eggermont ................. 235/156 |
| 4,029,904 A | 6/1977 | Papeschi ..................... 178/88 |
| 4,141,209 A | 2/1979 | Barnett et al. ............. 58/23 A |
| 4,350,957 A | 9/1982 | Miyamoto .................. 329/107 |
| 4,397,210 A | 8/1983 | Finch ......................... 84/1.03 |
| 4,723,318 A | 2/1988 | Marshall ..................... 455/109 |
| 4,737,842 A | 4/1988 | Nagasaki ..................... 358/27 |
| 4,823,092 A | 4/1989 | Pennock ..................... 330/253 |
| 4,839,905 A | 6/1989 | Mantovani .................. 375/12 |
| 4,873,702 A | 10/1989 | Chiu ............................ 375/76 |
| 4,918,338 A | 4/1990 | Wong .......................... 307/521 |
| 5,018,524 A | 5/1991 | Gu et al. ..................... 128/421 |
| 5,182,477 A | 1/1993 | Yamasaki et al. ........... 307/494 |
| 5,222,078 A | 6/1993 | Cason et al. ................. 375/76 |
| 5,239,273 A | 8/1993 | Hedstrom et al. .......... 329/312 |
| 5,245,565 A | 9/1993 | Petersen et al. ............ 364/825 |

(Continued)

FOREIGN PATENT DOCUMENTS

EP 0 344 852 A1 12/1989

(Continued)

OTHER PUBLICATIONS

Hidehiko Kuroda et al., "Development of Low-Power Consumption RF/IF Single-Chip Transceiver IC for PHS,", Doc. No. XP-000832839, pp. 161-167, Compound Semiconductor Device Division, NEC IC Microcomputer Systems, Ltd.

(Continued)

*Primary Examiner*—Lana Le
(74) *Attorney, Agent, or Firm*—Haverstock & Owens LLP

(57) ABSTRACT

The mixer circuit is a singled ended input to a double balanced high dynamic range mixer with only two base-emitter junctions across the supply. It provides for the use of bondwires to off chip ground as DC block and DC feed elements. The single ended input and differential output balanced mixer is well suited for the input stage of an integrated radio receiver—off chip circuitry is usually single ended, but on chip circuits are usually differential. No off chip differential RF circuits or baluns are required which reduces off chip component count and improves radio performance. The mixer circuit has lower LO drive requirements because of the DC coupled LO port. This results in better radio performance and a smaller die area because of the DC coupled IF port.

36 Claims, 7 Drawing Sheets

U.S. PATENT DOCUMENTS

| | | | |
|---|---|---|---|
| 5,303,420 A | 4/1994 | Jang | 455/343 |
| 5,345,190 A | 9/1994 | Kaylor | 330/258 |
| 5,353,307 A | 10/1994 | Lester et al. | 375/14 |
| 5,432,779 A | 7/1995 | Shimo et al. | 370/30 |
| 5,491,447 A | 2/1996 | Goetschel et al. | 330/254 |
| 5,625,583 A | 4/1997 | Hyatt | 365/45 |
| 5,633,896 A | 5/1997 | Carlin et al. | 375/340 |
| 5,663,989 A | 9/1997 | Fobbester | 375/344 |
| 5,680,072 A | 10/1997 | Vulih et al. | 327/554 |
| 5,734,294 A | 3/1998 | Bezzam et al. | 327/552 |
| 5,825,257 A | 10/1998 | Klymyshyn et al. | 332/100 |
| 5,890,051 A | 3/1999 | Schlang et al. | 455/76 |
| 5,894,496 A | 4/1999 | Jones | 455/126 |
| 5,903,820 A | 5/1999 | Hagstrom | 455/82 |
| 5,936,474 A | 8/1999 | Rousselin | 331/34 |
| 5,937,335 A | 8/1999 | Park et al. | 455/86 |
| 5,953,640 A | 9/1999 | Meador et al. | 455/73 |
| 5,960,046 A | 9/1999 | Morris et al. | 375/347 |
| 5,966,666 A | 10/1999 | Yamaguchi et al. | 455/552 |
| 6,060,935 A | 5/2000 | Shulman | 327/345 |
| 6,118,811 A | 9/2000 | Narumi et al. | 375/219 |
| 6,127,884 A | 10/2000 | Rishi | 229/304 |
| 6,175,746 B1 | 1/2001 | Nakayama et al. | 455/552 |
| 6,226,276 B1 | 5/2001 | Na | 370/294 |
| 6,256,511 B1 | 7/2001 | Brown et al. | 455/552 |
| 6,275,101 B1 | 8/2001 | Underhill | 327/551 |
| 6,313,885 B1 | 11/2001 | Patel et al. | 348/725 |
| 6,343,207 B1 | 1/2002 | Hessel et al. | 455/86 |
| 6,370,205 B1 | 4/2002 | Lindoff et al. | 375/319 |
| 6,480,553 B1 | 11/2002 | Ho et al. | 375/272 |
| 6,484,014 B1 | 11/2002 | Koszarsky | 455/86 |
| 6,516,186 B1 | 2/2003 | Yamagishi et al. | 455/302 |
| 6,603,818 B1 | 8/2003 | Dress, Jr. et al. | 375/295 |
| 6,920,311 B1 * | 7/2005 | Rofougaran et al. | 455/313 |
| 2001/0018334 A1 * | 8/2001 | Ipek et al. | 455/318 |

FOREIGN PATENT DOCUMENTS

| | | |
|---|---|---|
| EP | 0 576 082 A1 | 12/1993 |
| EP | 0 660 504 A1 | 6/1995 |
| EP | 0 723 335 A1 | 7/1996 |
| EP | 0 833 482 A2 | 4/1998 |
| EP | 0 948 129 A1 | 10/1999 |
| GB | 2330 279 A | 4/1999 |

OTHER PUBLICATIONS

Angel Boveda et al., "GaAs Monolithic Single-Chip Transceiver,", Doc. No. XP-000538492, pp. 31-34, IEEE, May 15, 1995.

* cited by examiner

US 7,027,792 B1

TOPOLOGY FOR A SINGLE ENDED INPUT DUAL BALANCED MIXER

RELATED APPLICATIONS

This application claims priority under 35 U.S.C. § 119(e) of the co-pending U.S. provisional application Ser. No. 60/167,188 filed on Nov. 23, 1999 and entitled "NOVEL TOPOLOGY FOR A SINGLE ENDED INPUT DUAL BALANCED MIXER." The provisional application Ser. No. 60/167,188 filed on Nov. 23, 1999 and entitled "NOVEL TOPOLOGY FOR A SINGLE ENDED INPUT DUAL BALANCED MIXER" is also hereby incorporated by reference.

FIELD OF THE INVENTION

This invention relates to the field of radio frequency (RF) mixers. More particularly, this invention relates to dual balanced RF mixers with a single ended input.

BACKGROUND OF THE INVENTION

Mixer circuits are well known in the electronics industry. Mixers have many applications and their use has been extensive. One of the more common applications has been in radio frequency receivers as frequency multipliers or converters. Typically in these types of applications, an incoming modulated RF signal is combined with the signal of a local oscillator (LO) to produce a modulated intermediate frequency (IF) signal. The IF output of the mixer is the difference and sum of the frequencies between the RF and LO frequencies and is then further processed by other known circuits or devices, such as an on-chip active filter.

Many types of mixers are known. One example of a mixer commonly known in the art is the double balanced mixer or the 'Gilbert Cell' or 'Gilbert Mixer' as shown in FIG. 1. The Gilbert cell is named after its inventor and since then many other mixer topologies have utilized this basic approach. Further modifications and enhancements to the Gilbert cell have been made and are known in the art as will be discussed hereinafter.

The conventional Gilbert cell mixer 10 of FIG. 1 is made up of a RF input stage 20 and a mixer core 30. The RF input stage includes two transistors Q1 and Q2. The base terminal of the first transistor Q1 is coupled to one of two RF signal inputs. The emitter terminal of the first transistor Q1 is coupled to the emitter terminal of the second transistor Q2 and to the current source I1. The collector terminal of the first transistor Q1 is connected to the first pair of differentially connected transistors Q3 and Q4 in the mixer core. The base terminal of the second transistor Q2 is coupled to the second RF signal input. The collector of the second transistor Q2 is coupled to the second pair of differentially connected transistors Q5 and Q6 in the mixer core.

The mixer core is made up of four transistors Q3, Q4, Q5, Q6 coupled as two differentially cross-coupled pairs. The first differentially cross-coupled pair Q3 and Q4 is commonly connected by way of the emitter terminals and further connected to the collector of the first transistor Q1 in the RF input stage. The second differentially cross-coupled pair Q5 and Q6 is also connected by common emitters and further coupled to the collector of the second transistor Q2 in the RF input stage. The base terminal of the first transistor Q3 in the first differential cross-coupled pair of transistors is coupled to the base terminal of the second transistor Q6 of the second differential cross-coupled pair and further coupled to one of two LO input terminals. Similarly, the base terminal of the second transistor Q4 of the first differential cross-coupled pair is coupled to the base terminal of the first transistor Q5 of the second differential cross-coupled pair and further coupled to the second LO input terminal. The collector terminal of the first transistor Q3 of the first differential cross-coupled pair is coupled to the collector terminal of the first transistor Q5 of the second differential cross-coupled pair and further connected to one of two IF output terminals. The collector terminal of the second transistor Q4 of the first differential cross-coupled pair is coupled to the collector terminal of the second transistor Q6 of the second differential cross-coupled pair and further connected to the second IF output terminal.

The operation of the Gilbert cell mixer is well known and need not be elaborated here. In spite of the advantages of the Gilbert cell, there are inherent limitations. For example, the Gilbert cell has limited dynamic range, which is the difference between IP3 (third order intercept point) and noise figure for a given power consumption. The Gilbert mixer's noise figure, linearity, and current drain performance also have been conventionally defined. Consequently, inventions since the introduction of the Gilbert cell have centered on improving various parametric concerns usually dependent on unique mixer applications. One such case is the 'Micromixer' which is described in detail in "The MICROMIXER: A Highly Linear Variant of the Gilbert Mixer Using a Bisymmetric Class-AB Input Stage," by Barrie Gilbert, IEEE Journal of Solid-State Circuits, Vol. 32, No. 9, September 1997 and hereby incorporated by reference.

Referring to FIG. 2, the difference between the Micromixer and the Gilbert mixer of FIG. 1 is apparent. The differential pair in the RF Input section of the Gilbert cell of FIG. 1 has been replaced by a bisymmetric Class AB topology in the Micromixer of FIG. 2. The operation of the Micromixer is also known in the art. This improvement over the Gilbert mixer results in increased mixer performance by way of increased linearity, accurate input impedance, high intermodulation intercepts and nearly unlimited signal capacity. It does not, however, significantly improve noise figure.

Another technique to improve the performance of conventional Gilbert mixers is the use emitter degeneration resistors. This technique, however, introduces resistive thermal noise, which degrades the dynamic range of the differential pair in the RF input section. Yet another technique to improve the performance of the Gilbert mixer involves the use of multi-tanh doublets or triplets as demonstrated in U.S. Pat. No. 6,054,889, "Mixer with Improved Linear Range." While the use of multi-tanh doublet or triplet approach into a conventional Gilbert mixer improves its performance, it does so at the expense of increasing complexity and loss of valuable chip real estate. Additionally, matching impedance to 50 Ω typically requires impedance transformation at the input.

In other types of mixers, the diode ring and Schottky diode ring mixer for example, the use of baluns, active or passive, increase mixer performance. As demonstrated in U.S. Pat. No. 6,094,570, "Double-balanced Monolithic Microwave Integrated Circuit Mixer" and U.S. Pat. No. 6,078,802, "High Linearity Active Balance Mixer, the use of baluns is known in the art and provide the transfer of RF energy from an unbalanced structure to a balanced structure thereby increasing mixer parametric performance such as linearity and impedance matching for example. Despite advances in integrated circuit fabrication, the use of baluns still take up valuable chip real estate and their use is a compromise in circuit design.

What is needed is a mixer circuit that addresses the known deficiencies in the prior art mixers. Specifically, what is needed is an improved mixer circuit, which provides increased mixer performance by way of a single ended input, and which exhibits a high dynamic range, a low noise figure, and with no off chip differential RF circuit or baluns required.

SUMMARY OF THE INVENTION

Briefly, according to the invention, a mixer circuit having a single ended input and a dual output is provided. The mixer circuit is a singled ended input to a double balanced high dynamic range mixer with only two base-emitter junctions across the supply. It provides for the use of bondwires to off chip ground as DC block and DC feed elements. The single ended input and differential output balanced mixer is well suited for the input stage of an integrated radio receiver—off chip circuitry is usually single ended, but on chip circuits are usually differential. No off chip differential RF circuits or baluns are required which reduces off chip component count and improves radio performance. The mixer circuit has lower LO drive requirements because of the DC coupled LO port. This results in better radio performance and a smaller die area because of the DC coupled IF port.

The combination of all embodiments described results in a mixer performance significantly higher than the well known Gilbert Cell mixer, and whose RF, LO and IF ports require no extra on chip or off chip interface circuits. The first implementation is for 900 MHz operation in the IRIS 900 low IF receiver section. As a regular down conversion mixer (FIG. 3) it achieves a noise figure of 5.5 dB, a power gain of 9 dB, an input IP3 of −8 dBm, and an input P1 dB of −16 dBm. Because of the impedance change from 50 ohms matched at the input to 1K+1K differential open circuit at the output, the voltage gain is 28 dB. Power consumption is 7 mA from a 2.9 V supply. Used as a quadrature image rejection mixer the noise figure is 8.5 dB with the same gain and large signal performance.

DETAILED DESCRIPTION OF A PREFERRED EMBODIMENT

This novel mixer topology circuit was developed as the input stage of the highly integrated receiver. This application requires a down conversion mixer with a higher dynamic range than the standard Gilbert cell, and with a single ended input to interface to an off chip filter. The mixer input is at 902–928 MHz, and its output is at the 1.024 MHz intermediate frequency of the receiver.

Figure 1:
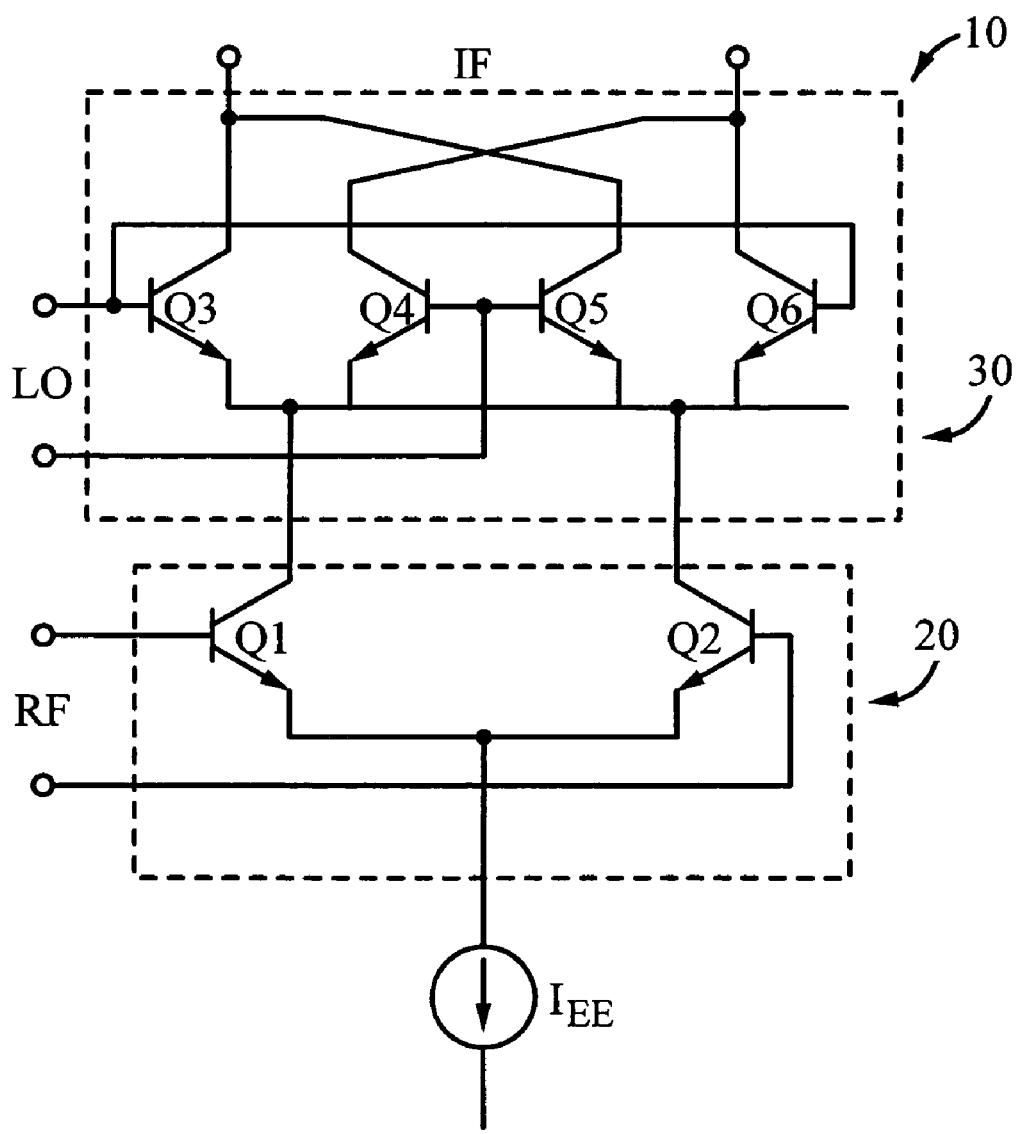
FIG. 1 is a schematic drawing of a prior art Gilbert Cell mixer.
Figure 2:
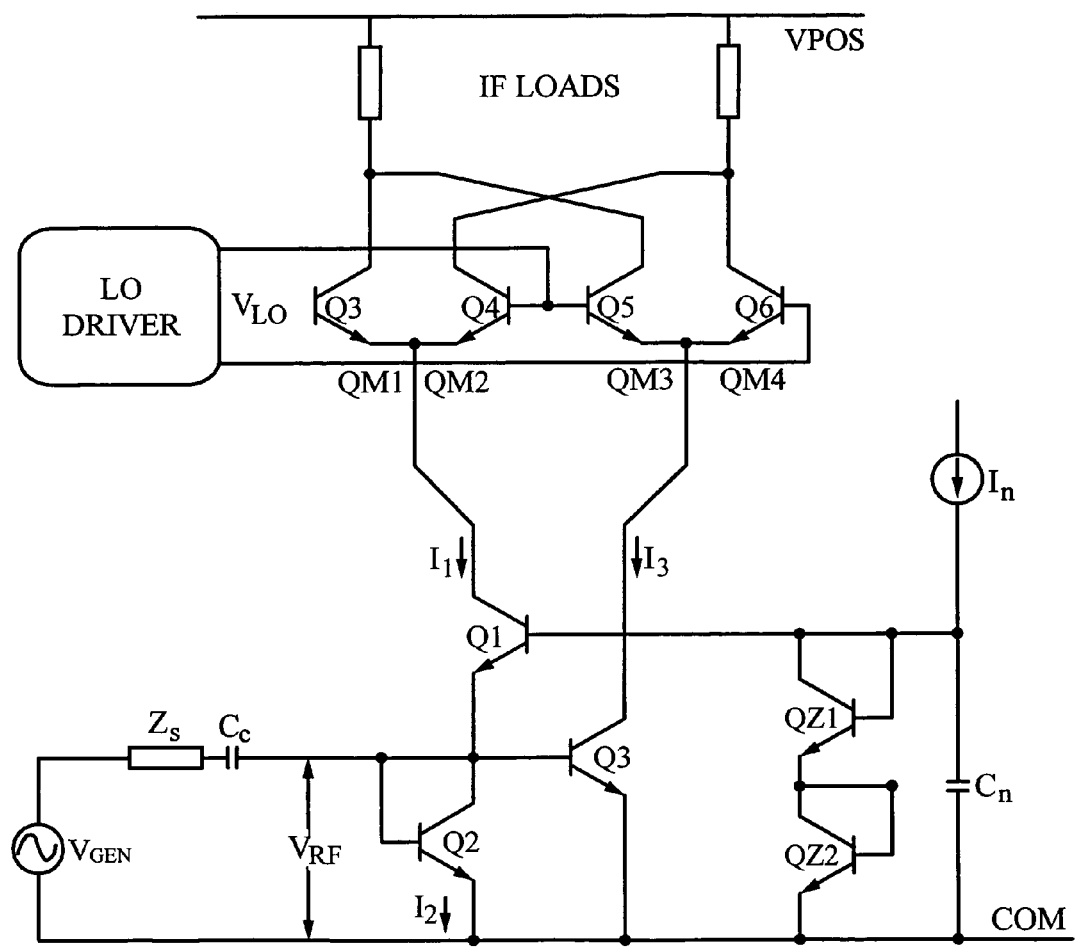
FIG. 2 is a schematic drawing of a prior art MICRO-MIXER balanced mixer.
Figure 3:
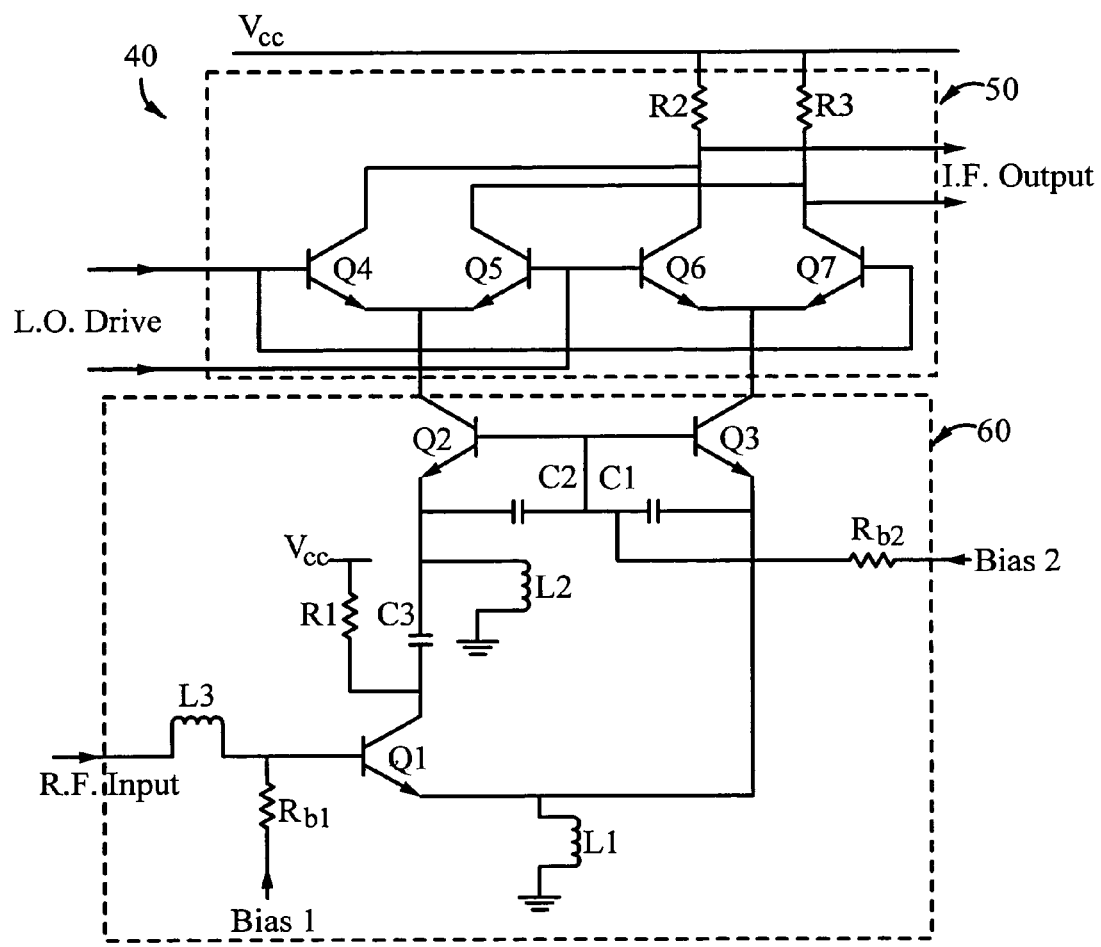
FIG. 3 is a schematic drawing of a basic mixer according to the invention.

FIG. 3 shows the basic features of the new invention. The mixer 40 is generally shown. The mixer includes the mixer core 50 and the RF input stage 60. The mixer core 50 is coupled to the RF input stage 60. The mixer core 50 includes four transistors Q4–Q7 coupled as two differentially cross-coupled pairs as in the prior art of FIG. 2. The first differential transistor pair Q4 and Q5 are common emitter connected to the RF input stage 60 by way of the collector terminal of a transistor Q2 in the RF input stage 60. Similarly, the second differential transistor pair Q6 and Q7 are also common emitter coupled to the RF input stage 60 by way of the collector terminal of transistor Q3 in the RF input stage 60.

The base terminal of the first transistor Q4 in the first differential pair of transistors is coupled to the base terminal of the second transistor Q7 of the second differential pair and further coupled to one of two LO input terminals. Similarly, the base terminal of the second transistor Q5 of the first differential pair is coupled to the base terminal of the first transistor Q6 of the second differential pair and further coupled to the second LO input terminal. The collector terminal of the first transistor Q4 of the first differential pair is coupled to the collector terminal of the first transistor Q6 of the second differential pair and further connected to one of two IF output terminals and to the first terminal of a load resistor R2. The second terminal of the load resistor R2 is coupled to a voltage source $V_{CC}$. The collector terminal of the second transistor Q5 of the first differential pair is coupled to the collector terminal of the second transistor Q7 of the second differential pair and further connected to the second IF output terminal and to a second load resistor R3. The second terminal of the second load resistor R3 is also connected to the voltage source $V_{CC}$.

Referring to the RF input stage 60, the RF input signal is applied to the base of a first transistor Q1 via a matching network. Here, an inductor L3 is used as a matching network, however it is understood that other types of matching networks could be used. The first transistor Q1 has three principle functions:

1. It presents a reasonable input impedance (e.g. only one external inductor is required to match the input to 50 ohms);
2. It acts as phase splitter, producing out of phase waveforms at its collector and emitter.
3. It acts as a low noise input device, defining the noise figure of the mixer.

The base terminal of the first transistor Q1 is coupled to one terminal of an inductor L3 and to a biasing resistor $R_{b1}$. The second terminal of the inductor L3 is coupled to the RF input. The second terminal of the resistor $R_{b1}$ is coupled to a bias current source Bias 1. The emitter terminal of the first transistor Q1 is coupled to the first terminal of an inductor L1 and further coupled to the emitter of a cascode transistor Q3. The second terminal of the inductor L3 is coupled to ground. The collector terminal of the first transistor Q1 is coupled to the first terminal of a resistor R1 and to the first terminal of a capacitor C3. The second terminal of the resistor R1 is coupled to a voltage source $V_{CC}$ for example. The second terminal of the capacitor C3 is coupled to the first terminal of the inductor L2 and to the emitter terminal of a cascode transistor Q2.

The RF input stage 60 further includes two cascode transistors Q2 and Q3 having a common base connection. The emitter terminal of the first cascode transistor Q2 is coupled to the collector of the first transistor Q1 by way of the connections to the capacitor C3 and the resistor R1. The emitter terminal of the second cascode transistor Q3 is coupled to the emitter terminal of the first transistor Q1 and to the first terminal of the inductor L1. The emitter terminals of the cascode transistors Q2 and Q3 are further coupled to two capacitors C1 and C2 in series and further coupled to a bias source, Bias 2.

In operation, the two cascode transistors Q2 and Q3 isolate the RF input stage 60 circuitry from the mixer core's LO drive signal and its harmonics. The mixer core's differentially coupled transistors Q4, Q5, Q6, and Q7 perform the frequency conversion from RF to IF. They act as an analog multiplier, so that the output current from the four transistors Q4, Q5, Q6, and Q7 is the product of the RF input and the LO signals. These currents develop a differential output voltage across the load resistors R2 and R3.

The cascode arrangement of the two cascode transistors Q2 and Q3 is 'folded' to increase the headroom available at the output. The emitter of the first transistor Q1 can be directly connected to the emitter of the second cascode transistor Q3, and the capacitor C3 level shifts the signal between the collector of the first transistor Q1 and the emitter of the first cascode transistor Q2.

The two inductors L1 and L2 in combination with the capacitors form a tuned circuit and provide a DC feed path, keeping the emitters of the two cascode transistor Q2 and Q3 at the same DC potential. The inductors L1, L2, and part of the input matching inductor L3 can be IC package inductances so on chip inductors are not required. The capacitors C1 and C2 tune out the inductance of the two inductors L1 and L2, and provide an RF 'center' 'tap' to define the RF voltage at the bases of the two cascode transistors Q2 and Q3.

In further embodiments of the invention, different transistors could be used. For example, the circuits presented could be undertaken with NPN transistors, PNP transistors, MOSFET or MESFET devices or any combination thereof using conventional design techniques for such substitutions.

Quadrature Mixer

In another embodiment of the invention, a quadrature mixer is presented. Quadrature mixers are used in image rejection, Low IF or Zero IF applications. To form the quadrature mixer circuit of this embodiment, the mixer core 20 of FIG. 3 (Q4–Q7) can be duplicated and the RF input stage 60 of FIG. 3 can be modified to provide two sets of cascode transistors as is shown in FIG. 4.

Figure 4:
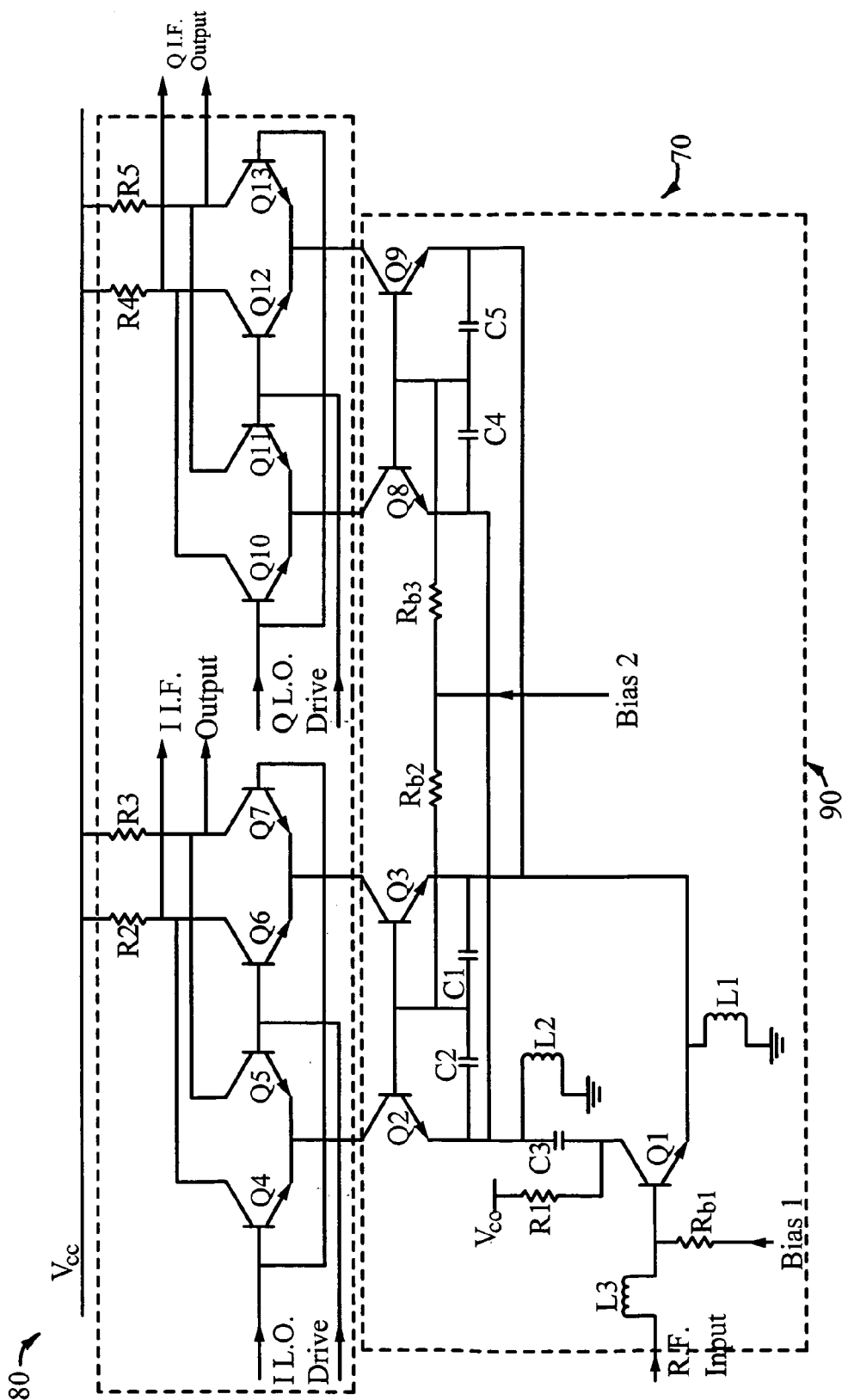
FIG. 4 is a schematic drawing of a quadrature mixer according to the present invention.

The quadrature mixer 70 of FIG. 4, thus, is made up of a mixer core 80 and a RF input stage 90. The mixer core 80 consists of two sets of four transistors Q4–Q7 and Q10–Q13 coupled as four differentially cross-coupled transistor pairs. The first set of differentially cross coupled transistors pairs Q4–Q7 in the mixer core 70 is identical to the transistors in the mixer core of FIG. 3.

Referring to FIG. 4 and the first set of differentially cross-coupled transistors pairs Q4–Q7, the base terminal of the first transistor Q4 in the first differential pair of transistors Q4, Q5 is coupled to the base terminal of the second transistor Q7 of the second differential pair Q6, Q7 and further coupled to one of two In-Phase LO input terminals. Similarly, the base terminal of the second transistor Q5 of the first differential pair Q4, Q5 is coupled to the base terminal of the first transistor Q6 of the second differential pair Q6, Q7 and further coupled to the second In-Phase LO input terminal. The collector terminal of the first transistor Q4 of the first differential pair Q4, Q5 is coupled to the collector terminal of the first transistor Q6 of the second differential pair Q6, Q7 and further coupled to one of two In-Phase IF output terminals and to the first terminal of a load resistor R2. The second terminal of the load resistor R2 is coupled to a voltage source $V_{CC}$. The collector terminal of the second transistor Q5 of the first differential pair Q4, Q5 is coupled to the collector terminal of the second transistor Q7 of the second differential pair Q6, Q7 and further connected to the second In-Phase IF output terminal and to a first terminal of a second load resistor R3. The second terminal of the second load resistor R3 is also coupled to the voltage source $V_{CC}$.

The first differential transistor pair Q4, Q5 of the first set of differentially cross coupled transistors pairs Q4–Q7, are common emitter connected to the RF input stage 90 and further connected to the collector terminal of a transistor Q2 in the RF input stage 90. Similarly, the second differential transistor pair Q6, Q7 are also common emitter connected to the RF input stage 90 by way of the collector terminal of a transistor Q3 in the RF input stage 90.

Referring again to FIG. 4 and now the second set of differentially cross coupled transistors pairs Q10–Q13, the base terminal of the first transistor Q10 in the first differential pair of transistors Q10, Q11 is coupled to the base terminal of the second transistor Q13 of the second differential pair Q12, Q13 and further coupled to one of two Quadrature Phase LO input terminals. Similarly, the base terminal of the second transistor Q11 of the first differential pair of transistors Q10, Q11 is coupled to the base terminal of the first transistor Q12 of the second differential pair of transistors Q12, Q13 and further coupled to the second Quadrature Phase LO input terminal. The collector terminal of the first transistor Q10 of the first differential pair of transistors Q10, Q11 is coupled to the collector terminal of the first transistor Q12 of the second differential pair of transistors Q12, Q13 and further coupled to one of two Quadrature Phase IF output terminals and to the first terminal of a load resistor R4. The second terminal of the load resistor R4 is coupled to a voltage source $V_{CC}$. The collector terminal of the second transistor Q11 of the first differential pair of transistors Q10, Q11 is coupled to the collector terminal of the second transistor Q13 of the second differential pair of transistors Q12, Q13 and further coupled to the second Quadrature Phase IF output terminal and to a first terminal of a second load resistor R5. The second terminal of the second load resistor R5 is also coupled to the voltage source $V_{CC}$.

The first differential transistor pair Q10, Q11 of the second set of differentially cross coupled transistors pairs Q10–Q13, have their common emitters connected to the RF input stage 90 by way of the collector terminal of a transistor Q8 in the RF input stage 90. Similarly, the second differential transistor pair Q12, Q13 are also common emitter coupled to the RF input stage 90 by way of the collector terminal of a transistor Q9 in the RF input stage 90.

Referring now to the RF input stage 90 of FIG. 4, the base terminal of the input transistor, Q1, is coupled to one terminal of a biasing resistor, $R_{b1}$ and to an inductor, L3. The second terminal of the inductor L3 is coupled to the RF signal input. The second terminal of the biasing resistor $R_{b1}$ is coupled to a bias current source Bias 1. The emitter terminal of the input transistor Q1 is coupled to the first terminal of an inductor L1 and further coupled to the emitter terminals of two cascode transistors Q3, Q9. The second terminal of the inductor L3 is coupled to ground. The collector terminal of the input transistor Q1 is coupled to the first terminal of a resistor R1 and to the first terminal of a capacitor C3. The second terminal of the resistor R1 is coupled to a voltage source $V_{CC}$ for example. The second terminal of the capacitor C3 is coupled to the first terminal of the inductor L2 and to the emitter terminals of two cascode transistors Q2, Q8.

The RF input stage 90 includes two pairs of cascode transistors Q2, Q3 and Q8, Q9. The first pair of cascode transistors Q2, Q3 has a common base connection and is further coupled to two capacitors C1, C2 and to the first terminal of a biasing resistor $R_{b2}$. The emitter terminal of the first cascode transistor Q2 of the first pair of cascode transistors Q2, Q3 is coupled to the collector terminal of the input transistor Q1 by way of the connections to the capacitor C3 and the inductor L2. The emitter terminal of the second cascode transistor Q3 of the first pair of cascode transistors Q2, Q3 is coupled to the emitter terminal of the input transistor Q1 and the emitter terminal of the second cascode transistor Q9 of the second pair of cascode transistors Q8, Q9, and to the first terminal of the inductor L1. The emitter terminals of the first pair of cascode transistors Q2, Q3 are further conupled to two capacitors C1 and C2 in series and further coupled to a bias source, Bias 2 by way of a biasing resistor $R_{b2}$.

The second pair of cascode transistors Q8, Q9 also have a common base connection. The base terminals of the second pair of cascode transistors Q8, Q9 are further coupled to the first terminal of a biasing resistor $R_{b3}$ and to two capacitors C4, C5. The emitter terminal of the first cascode transistor Q8 of the second pair of cascode transistors Q8, Q9 is coupled the emitter terminal of the input transistor Q1 and to the first cascode transistor Q2 of the first pair of cascode transistors Q1, Q2. The emitter terminal of the second cascode transistor Q9 of the second pair of cascode transistors Q8, Q9 is coupled the input transistor Q1 and to the second cascode transistor Q3 of the first pair of cascode transistors Q2, Q3. The second terminal of the biasing resistor $R_{b2}$ is coupled to the second terminal of the biasing resistor $R_{b3}$ and further coupled to a bias source Bias 2.

In operation the quadrature mixer operates similarly to other quadrature mixers. The output current from the input transistor is split between the two sets of cascode transistors. If a quadrature pair of LO drive signals is provided to the LO ports, then a quadrature IF output is available at the two IF ports. The LO input signals in the quadrature mixer are the in-phase portion and the quadrature phase portion of the LO drive signal. The IF output signals are the in-phase portion and the quadrature phase portion of the IF output signal.

RF Feedback

Figure 5:
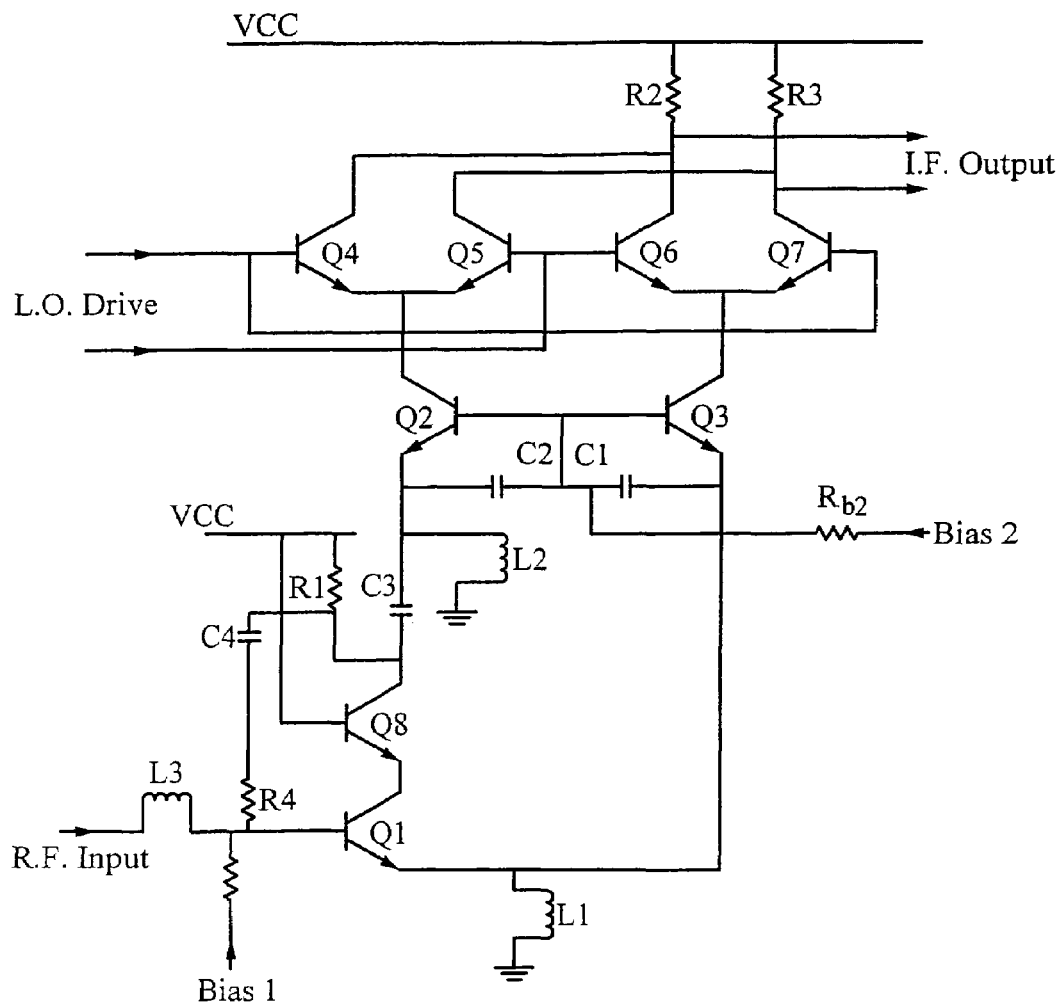
FIG. 5 is a schematic drawing of a mixer with a cascode connection of Q1 with RF feedback.

Referring to FIG. 5, another embodiment is presented to improve the phase splitting capacity of the input transistor and thereby improve the overall mixer performance. The single input transistor Q1 does not give a perfect 180-degree phase split between its collector and emitter terminals. Some of this is caused by the differing impedances at the collector and base—the impedance at the emitter terminal of a second cascode transistor Q3 is half that at the emitter terminal of a first cascode transistor Q2. Another cause of error is the capacitive feedback through the base-collector capacitance of the single input transistor Q1. To improve the phase balance and accurately define the gain, the single input transistor Q1 can be replaced with a cascode connection of two transistors and a resistive feedback added to define the forward gain.

The mixer circuit of FIG. 5 is identical to the mixer circuit of FIG. 3 with the exception of the an added cascode transistor Q8 coupled to the input transistor Q1 and the added resistive feedback circuit including of a capacitor C4 coupled in series to a resistor R4. Referring to FIG. 5, the collector terminal of the input transistor Q1 is coupled to the emitter terminal of the cascode transistor Q8. The base terminal of the cascode transistor Q8 is coupled to a voltage source Vcc. The collector terminal of the cascode transistor Q8 is coupled to the first terminal of a resistor R1 and to the first terminal of a capacitor C3, which is similar to the connection of the input transistor Q1 in FIG. 3 and further coupled to a first terminal of another capacitor C4. The second terminal of the capacitor C4 is coupled to the first terminal of a resistor R4. The second terminal of the resistor R4 is coupled to the base terminal of the input transistor Q1.

LO Port Biasing

To obtain the maximum dynamic range from these mixers, enough voltage headroom must be preserved at the collectors terminals of the differentially cross coupled transistors Q4–Q7 that the full output signal can be developed across the load resistors R2 and R3. At the same time, to stabilize the gain of the mixer it is desirable to keep the transconductances of the transistors constant with temperature. This requires that the bias current be proportional to absolute temperature (PTAT). If the LO inputs are driven by a Common Mode Logic (CML) buffer with emitter follower outputs (common collector amplifiers), then the common mode DC voltage at the LO inputs will be at $V_{CC}-V_{be}$, and will rise with temperature. The voltage drop across the load resistors R2, R3 will increase with temperature because of the PTAT biasing. The combined effect is to reduce the $V_{CE}$ of the differentially cross-coupled transistors Q4–Q7 at high temperatures, leading to saturation. Reducing the load resistors R2, R3 to avoid saturation at high temperature results in a loss of gain, and poor use of available supply voltage.

The solution employed is to power the LO buffers from a tracking supply. The supply generates $3*V_{be}+0.2$ V. This keeps the $V_{cb}$ of the cascode devices (Q2 and Q3) constant at around 0 V. The total headroom at the load resistors R2, R3 is from $V_{bc}+V_{cesat}+0.2$ to $V_{cc}$. This headroom increases with temperature to allow for the PTAT current bias.

Figure 6:
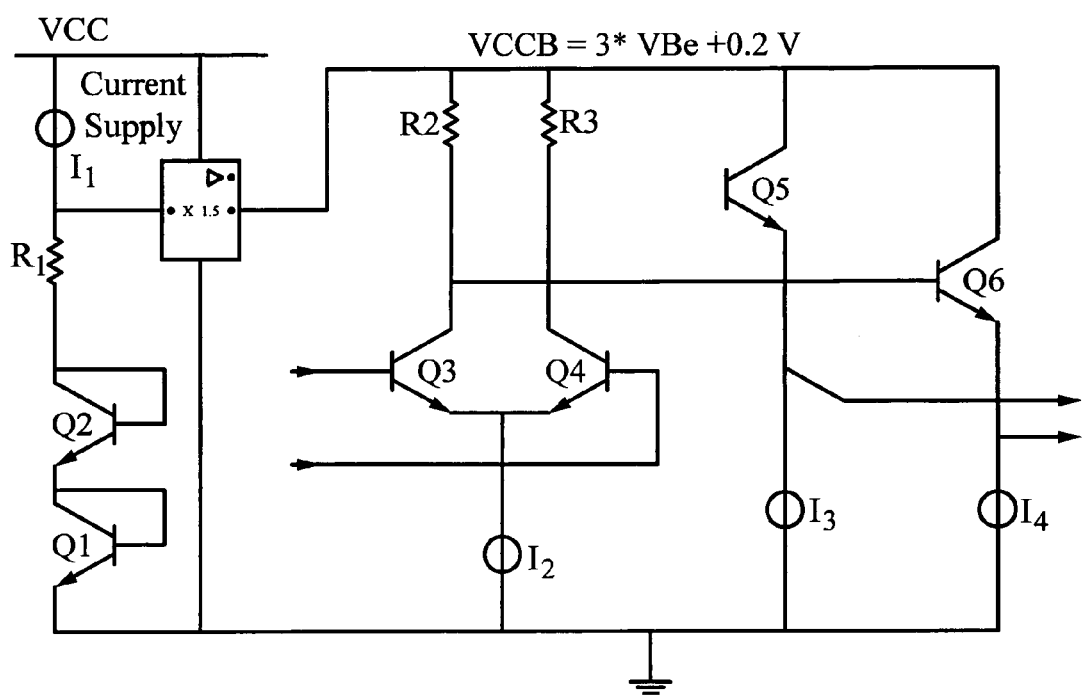
FIG. 6 is a schematic drawing of a tracking supply for LO buffers.

Referring to FIG. 6, one implementation of a tracking supply is shown. It is a conventional low dropout voltage regulator, except that the reference voltage is $2*V_{be}+133$ mV. The amplifier has a closed loop gain of 1.5, so that the output voltage of the regulator is $3*V_{be}+0.2$ V. FIG. 6 shows a single CML buffer with emitter followers. The common mode voltage at the output of the followers will be at $+2*V_{be}$, and remain there over process and temperature variations.

The tracking supply of FIG. 6 includes a first diode-connected transistor Q1 in series with a second diode-connected transistor Q2 and a resistor R1 in series with the second diode-connected transistor Q2. The cathode of the first diode-connected transistor Q1 is coupled to ground and the anode is coupled to the cathode of the second diode-connected transistor Q2. The anode of the second diode-connected transistor Q2 is coupled to the first terminal of a resistor R1. The second terminal of the resistor R1 is coupled to a current source, which is coupled to the voltage source $V_{CC}$.

The tracking supply circuit further includes an amplifier and a CML buffer. The amplifier includes four terminals. The first terminal of the amplifier is coupled to the second terminal of the resistor R1 and to a current source. The second terminal of the amplifier is coupled to the voltage supply $V_{CC}$. The third terminal of the amplifier is coupled to ground and the fourth terminal is coupled to the CML buffer.

The CML buffer includes two common emitter coupled transistors Q3, Q4. The emitter terminals of the two common emitter transistors Q3, Q4 are coupled together and further coupled to ground by way of a connection to a current supply. The base terminal of the first transistor Q3 is coupled to one of two LO drive inputs. The collector terminal of the first transistor Q3 is coupled to the base of one of two common collector amplifiers Q6 and to a first terminal of a resistor R2. The base terminal of the second transistor Q4 is coupled to the second LO drive input. The collector terminal of the second transistor Q4 is coupled to the base terminal of the second common collector amplifier Q5 and to a first terminal of a resistor R3. The emitter of the first common collector amplifier Q5 is coupled to one of two mixer LO drive input terminals and to ground by way of a current source. The collector terminal of the first common collector amplifier Q5 is coupled to the collector terminal of the second common collector amplifier Q6 and to the fourth terminal of the amplifier by way of connections to the second terminals of the first and second resistors R2, R3. The emitter of the second common collector amplifier Q6 is coupled to the second mixer LO drive input terminal and to ground by way of a current source.

Output Common Mode Voltage Control

The output of the mixer is buffered by emitter followers then feeds an on chip active filter for channel selectivity. Ideally the output of the mixer should be DC coupled to the filter. This requires that the common mode voltage at the mixer output match up with the common mode input range of the filter. The tracking bias circuit shown in FIG. 7 does this with a fairly simple replica bias generator.

Figure 7:
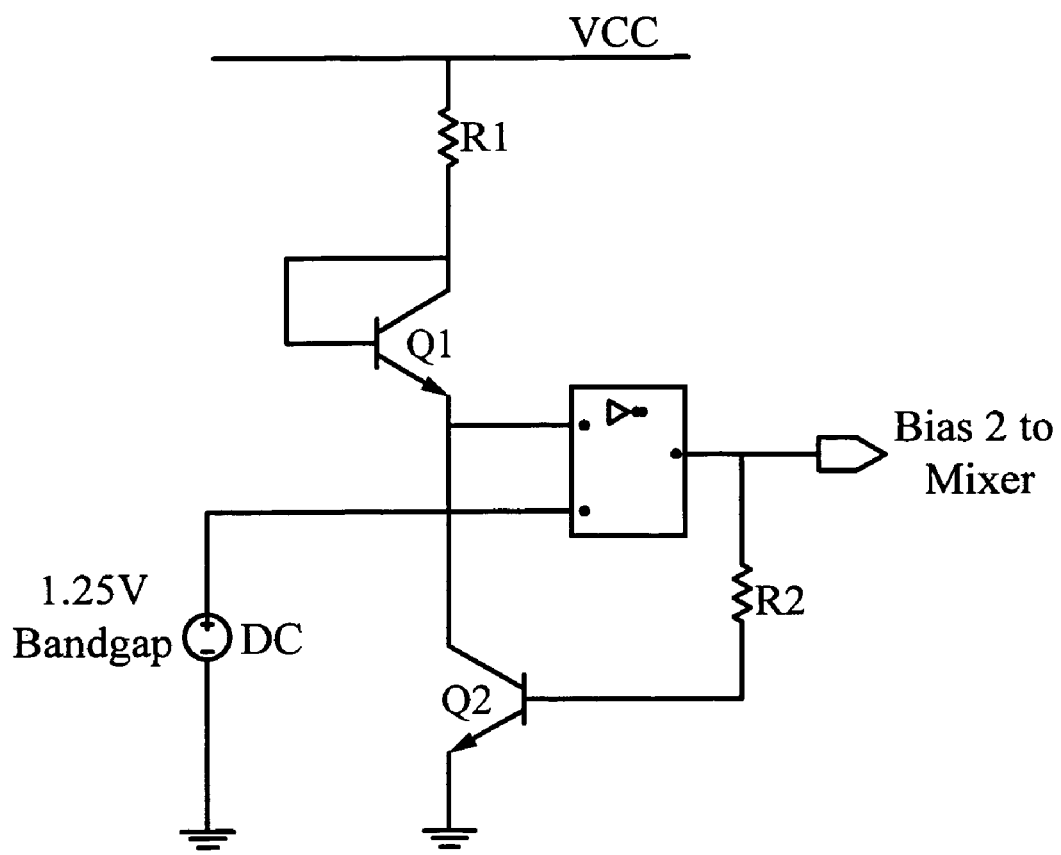
FIG. 7 is a schematic drawing of a tracking mixer bias current circuit.

Referring to FIG. 7, the tracking bias circuit consists of a first transistor Q1 coupled as a diode-connected transistor having an anode coupled to the first terminal a first resistor R1 and the cathode coupled to the collector terminal of a second transistor Q2. The second terminal of the resistor R1 is coupled to a voltage source $V_{CC}$. The emitter terminal of the second transistor Q2 is coupled to ground. The base terminal of the second transistor Q2 is coupled to the first terminal of a second resistor R2. The second terminal of the second resistor R2 is coupled to the output terminal of a loop amplifier and to the bias current terminal Bias 2 of the mixer.

The tracking bias circuit further includes a loop amplifier. The loop amplifier Q3 includes three terminals. The first terminal of the loop amplifier is coupled to the cathode terminal of the diode-connected transistor Q1. The second terminal of the loop amplifier is coupled to the first terminal of a bandgap voltage supply $V_{bg}$. The third terminal of the loop amplifier is coupled to the second terminal of the second resistor R2 and further coupled to the bias current terminal Bias 2 of the mixer. The second terminal of the bandgap voltage supply is coupled to ground.

In operation, the filter that follows the mixers has its input common mode range centered on the chip bandgap reference voltage ($V_{bg} \sim 1.25$ V). The desired output common mode voltage of the mixers is therefore $V_{bg}+V_{be}$. The simple circuit in FIG. 7 achieves this. R1, Q1 and Q2 are ratioed to the corresponding components in the mixer (R2 & R3, Q4 to Q7 and Q2 to Q3) so that they operate at the same current density. The loop amplifier compares the voltage at the first transistor Q1 emitter terminal (a replica of the mixer output common mode voltage) with the bandgap voltage (the desired common mode voltage). With the appropriate feedback, the mixer output common mode voltage is held at the bandgap voltage.

In the application with the mixer operating at a 2.9 V supply, this circuit also generates a partially PTAT bias current. The voltage across the mixer load resistors is $V_{CC}-V_{be}-V_{bg}$. With $V_{CC}-V_{bg}=1.65$ V the current in R1 is half PTAT. This partially compensates the temperature variation of the device transconductance.

The present invention has been described in terms of specific embodiments incorporating details to facilitate the understanding of the principles of construction and operation of the invention. Such references herein to specific embodiments and details thereof are not intended to limit the scope of the claims appended hereto. It will be apparent to those skilled in the art that modifications may be made in the embodiments chosen for illustration without departing from the spirit and scope of the invention. Specifically, it will be apparent to one of ordinary skill in the art that the circuits of the present invention could be implemented in several different ways and the circuits disclosed above are only illustrative of the preferred embodiments of the invention and are in no way limitations.

What is claimed is:

1. A mixer circuit for generating an IF output responsive to an RF input and a LO drive source, comprising:
   a mixer core having a doubly balanced mixer including a first differentially coupled transistor pair and a second differentially coupled transistor pair;
   an RF input circuit coupled to the mixer core, the RF input circuit comprising:
      a first inductor having a first terminal coupled to receive an RF input signal and a second terminal;
      a biasing resistor having a first terminal coupled to the second terminal of the first inductor and a second terminal coupled to a first bias voltage;
      a first input transistor having a first terminal coupled to the second terminal of the first inductor, a second terminal, and a third terminal;
      a second inductor having a first terminal coupled to the second terminal of the first input transistor and to the first differentially coupled transistor pair, the second inductor also having a second terminal coupled to a ground potential;
      a supply resistor having a first terminal coupled to the third terminal of the first input transistor and a second terminal coupled to a supply potential;
      a first capacitor having a first terminal also coupled to the third terminal of the first input transistor and a second terminal coupled to the second differentially coupled transistor pair; and
      a third inductor having a first terminal coupled to the second terminal of the first capacitor and a second terminal coupled to the ground potential.

2. The mixer circuit according to claim 1 wherein the first differentially coupled transistor pair, the second differentially coupled transistor pair and the first input transistor are all npn transistors.

3. The mixer circuit according to claim 1 wherein the first differentially coupled transistor pair, the second differentially coupled transistor pair and the first input transistor are all pnp transistors.

4. The mixer circuit according to claim 1 wherein the first differentially coupled transistor pair, the second differentially coupled transistor pair and the first input transistor are all MOSFET transistors.

5. The mixer circuit according to claim 1 wherein the first differentially coupled transistor pair, the second differentially coupled transistor pair and the first input transistor are all MESFET transistors.

6. A mixer circuit for generating an IF output responsive to an RF input and a LO drive source, comprising:
   a mixer core having a doubly balanced mixer including a first differentially coupled transistor pair and a second differentially coupled transistor pair, the mixer core coupled to receive a LO drive signal, the LO drive signal having a plurality of harmonics;
   a low noise RF input circuit coupled to the mixer core through a folded cascode circuit, the low noise RF input circuit coupled to receive an RF input signal, wherein the folded cascode circuit further isolates the low noise RF input circuit from the LO drive signal and the plurality of harmonics.

7. The mixer circuit as in claim 6 wherein the folded cascode circuit comprises:
   a first cascode transistor having an emitter terminal coupled to a second terminal of a first capacitor and to a first terminal of a first inductor, a collector terminal coupled to the second differentially coupled transistor pair and a base terminal,
   a second cascode transistor having a base terminal coupled to the base terminal of the first cascode transistor, an emitter terminal coupled to a first terminal of a second inductor and to an emitter terminal of a first transistor, and a collector terminal coupled to the first differentially coupled transistor pair,
   a second capacitor, having a first terminal coupled to the emitter terminal of the second cascode transistor and a second terminal coupled to the second terminal of the first capacitor, the base terminal of the first cascode transistor and to the base terminal of the second cascode transistor,
   a third capacitor, having a first terminal coupled to the emitter terminal of the first cascode transistor and a second terminal coupled to the second terminal of the second capacitor,
   a first resistor having a first terminal coupled to the first terminal of the second capacitor and a second terminal coupled to a second bias voltage.

8. The mixer circuit as in claim 7, wherein the low noise RF input circuit further includes a RF feedback circuit, the RF feedback circuit comprising:
   a second transistor having a base terminal coupled to the supply potential, an emitter terminal coupled to a collector terminal of the first transistor and a collector terminal coupled to a first terminal of a supply resistor and to a first terminal of the first capacitor,
   a feedback resistor, having a first terminal coupled to a base terminal of the first transistor and a second terminal,
   a fourth capacitor, having a first terminal coupled to the second terminal of the feedback resistor and a second terminal coupled to the first terminal of the supply resistor.

9. The mixer circuit as in claim 7, wherein the mixer core further includes a tracking supply circuit, the tracking supply circuit comprising:
   a first diode-connected transistor having a cathode terminal coupled to a ground potential and an anode terminal,
   a second diode-connected transistor having a cathode terminal coupled to the anode terminal of the first diode connected transistor and an anode terminal,
   a first resistor having a first terminal coupled to the anode terminal of the second diode connected transistor and a second terminal,
   a first current supply having a first terminal coupled to the second terminal of the first resistor and a second terminal coupled to the supply potential,
   a loop amplifier having a first terminal coupled to the second terminal of the first resistor and to the first terminal of the first current supply, a second terminal coupled to the supply potential, a third terminal coupled to the ground potential and a fourth terminal,
   a second resistor having a first terminal coupled to the fourth terminal of the loop amplifier and a second terminal,
   a third transistor having a collector terminal coupled to the second terminal of the second resistor, a base terminal coupled to receive a first LO drive signal and emitter terminal,
   a fourth transistor having a base terminal coupled to receive a second LO drive signal, an emitter terminal coupled to the emitter terminal of the second transistor and a collector terminal,
   a third resistor having a first terminal coupled to the fourth terminal of the loop amplifier and a second terminal coupled to the collector terminal of the third transistor
   a second current supply having a first terminal coupled to the emitter terminal of the third transistor and to the emitter terminal of the fourth transistor and a second terminal coupled to the ground potential,
   a first common collector amplifier having a base terminal coupled to the second terminal of the third resistor and to the collector terminal of the fourth transistor, a collector terminal coupled to the fourth terminal of the loop amplifier, and an emitter terminal coupled to a first mixer core LO input,
   a third current supply having a first terminal coupled to the emitter terminal of the first common collector amplifier and a second terminal coupled to the ground potential,
   a second common collector amplifier having a base terminal coupled to the second terminal of the fourth resistor and to the collector terminal of the second transistor, a collector terminal coupled to the fourth terminal of the loop amplifier and an emitter terminal coupled to a second mixer core LO input,
   a fourth current supply having a first terminal coupled to the emitter terminal of the second common collector amplifier and a second terminal coupled to the ground potential.

10. The mixer circuit as in claim 7, wherein the low noise RF input circuit further includes a tracking mixer bias current circuit coupled to the second bias input terminal, the tracking mixer bias current circuit comprising:
   a second resistor having a first terminal coupled to the supply potential and a second terminal,
   a first diode connected transistor having a anode terminal coupled to the second terminal of the second resistor and a cathode terminal,
   a second transistor having a collector terminal coupled to the cathode terminal of the first diode connected transistor, an emitter terminal coupled to the ground potential and a base terminal,
   a loop amplifier having a first terminal coupled to the emitter terminal of the first diode connected transistor and to the collector terminal of the second transistor, a second terminal coupled to the second bias voltage and a third terminal, a third resistor having a first terminal coupled to the base terminal of the second transistor and a second terminal coupled to the second terminal of the loop amplifier and to the second bias voltage, a bandgap voltage supply having a first terminal coupled to the ground potential and a second terminal coupled to the third terminal of the loop amplifier.

11. The mixer circuit as in claim 6, wherein the mixer core further includes a tracking supply circuit, the tracking supply circuit comprising:

a first diode-connected transistor having a cathode terminal coupled to a ground potential and an anode terminal, a second diode-connected transistor having a cathode terminal coupled to the anode terminal of the first diode connected transistor and an anode terminal, a first resistor having a first terminal coupled to the anode terminal of the second diode connected transistor and a second terminal, a first current supply having a first terminal coupled to the second terminal of the first resistor and a second terminal coupled to the supply potential, a loop amplifier having a first terminal coupled to the second terminal of the first resistor and to the first terminal of the first current supply, a second terminal coupled to the supply potential, a third terminal coupled to the ground potential and a fourth terminal, a second resistor having a first terminal coupled to the fourth terminal of the loop amplifier and a second terminal, a second transistor having a collector terminal coupled to the second terminal of the fourth resistor, a base terminal coupled to receive a first LO drive signal and emitter terminal, a third transistor having a base terminal coupled to receive a second LO drive signal, an emitter terminal coupled to the emitter terminal of the second transistor and a collector terminal, a third resistor having a first terminal coupled to the fourth terminal of the loop amplifier and a second terminal coupled to the collector terminal of the third transistor a second current supply having a first terminal coupled to the emitter terminal of the second transistor and to the emitter terminal of the third transistor and a second terminal coupled to the ground potential, a first common collector amplifier having a base terminal coupled to the second terminal of the third resistor and to the collector terminal of the third transistor, a collector terminal coupled to the fourth terminal of the loop amplifier, and an emitter terminal coupled to a first mixer core LO input, a third current supply having a first terminal coupled to the emitter terminal of the first common collector amplifier and a second terminal coupled to the ground potential, a second common collector amplifier having a base terminal coupled to the second terminal of the second resistor and to the collector terminal of the second transistor, a collector terminal coupled to the fourth terminal of the loop amplifier and an emitter terminal coupled to a second mixer core LO input, a fourth current supply having a first terminal coupled to the emitter terminal of the second common collector amplifier and a second terminal coupled to the ground potential.

12. The mixer circuit as in claim 6, wherein the low noise RF input circuit further includes a RF feedback circuit coupled to the RF input circuit, the RF feedback circuit comprising:

a second transistor having a base terminal coupled to a supply potential, an emitter terminal coupled to the collector terminal of the first transistor and a collector terminal coupled to a first terminal of the supply resistor and to a first terminal of the first capacitor, a feedback resistor, having a first terminal coupled to a base terminal of the first transistor and a second terminal, a second capacitor, having a first terminal coupled to the second terminal of the feedback resistor and a second terminal coupled to the first terminal of the supply resistor.

13. A quadrature mixer circuit for generating a quadrature IF output responsive to an RF input and a quadrature pair of LO drive signals, comprising:

a mixer core having a first doubly balanced mixer including a first differentially coupled transistor pair and a second differentially coupled transistor pair and a second doubly balanced mixer including a third differentially coupled transistor pair and a fourth differentially coupled transistor pair;

an RF input circuit coupled to the mixer core, the RF input circuit comprising:

an input inductor having a first terminal coupled to receive an RF input signal and a second terminal;

a biasing resistor having a first terminal coupled to the second terminal of the input inductor and a second terminal coupled to a first bias voltage;

a first input transistor having a base terminal coupled to the second terminal of the input inductor, an emitter terminal, and a collector terminal;

a second inductor having a first terminal coupled to the emitter of the first input transistor and to the first differentially coupled transistor pair and to the third differentially coupled transistor pair, the second inductor also having a second terminal coupled to a ground potential;

a supply resistor having a first terminal coupled to the collector of the first input transistor and a second terminal coupled to a supply potential;

a first capacitor having a first terminal also coupled to the collector of the first transistor and a second terminal coupled to the second differentially coupled transistor pair and to the fourth differentially coupled transistor pair; and a third inductor having a first terminal coupled to the second terminal of the first capacitor and a second terminal coupled to the ground potential.

14. The mixer circuit according to claim 6 wherein the first differentially coupled transistor pair, the second differentially coupled transistor pair and the first transistor are all npn transistors.

15. The mixer circuit according to claim 6 wherein the first differentially coupled transistor pair, the second differentially coupled transistor pair and the first transistor are all pnp transistors.

16. The mixer circuit according to claim 6 wherein the first differentially coupled transistor pair, the second differentially coupled transistor pair and the first transistor are all MOSFET transistors.

17. The mixer circuit according to claim 6 wherein the first differentially coupled transistor pair, the second differentially coupled transistor pair and the first transistor are all MESFET transistors.

18. A quadrature mixer circuit for generating a quadrature IF output responsive to an RF input and a quadrature pair of LO drive signals, comprising:
- a mixer core having a first doubly balanced mixer including a first differentially coupled transistor pair and a second differentially coupled transistor pair and having a second doubly balanced mixer including a third differentially coupled transistor pair and a fourth differentially coupled transistor pair; the mixer core coupled to receive a quadrature LO drive signal, the quadrature LO drive signal having a plurality of harmonics;
- a low noise RF input circuit coupled to the mixer core through a folded cascode circuit, the low noise RF input circuit coupled to receive an RF input signal, wherein the folded cascode circuit further isolates the low noise RF input circuit from the quadrature LO drive signal and the plurality of harmonics,
- a first cascode capacitor, a first terminal of the first cascode capacitor coupled to an emitter terminal of a first cascode transistor and a second node of the first cascode capacitor coupled to base terminals of the first cascode transistor and a second cascode transistor,
- a second cascode capacitor, a first terminal of the second cascode capacitor coupled to the base terminals of the first cascode transistor and the second cascode transistor and a second node of the second cascode capacitor coupled to an emitter terminal of the second cascode transistor.

19. The quadrature mixer circuit according to claim 13 wherein the first differentially coupled transistor pair, the second differentially coupled transistor pair, the third differentially coupled transistor pair, the fourth differentially coupled transistor pair and the first input transistor are all npn transistors.

20. The quadrature mixer circuit according to claim 13 wherein the first differentially coupled transistor pair, the second differentially coupled transistor pair, the third differentially coupled transistor pair, the fourth differentially coupled transistor pair and the first input transistor are all pnp transistors.

21. The quadrature mixer circuit according to claim 13 wherein the first differentially coupled transistor pair, the second differentially coupled transistor pair, the third differentially coupled transistor pair, the fourth differentially coupled transistor pair and the first input transistor are all MOSFET transistors.

22. The quadrature mixer circuit according to claim 13 wherein the first differentially coupled transistor pair, the second differentially coupled transistor pair, the third differentially coupled transistor pair, the fourth differentially coupled transistor pair and the first input transistor are all MESFET transistors.

23. The quadrature mixer circuit according to claim 18 wherein the first differentially coupled transistor pair, the second differentially coupled transistor pair, the third differentially coupled transistor pair, the fourth differentially coupled transistor pair and the first transistor are all npn transistors.

24. The quadrature mixer circuit according to claim 18 wherein the first differentially coupled transistor pair, the second differentially coupled transistor pair, the third differentially coupled transistor pair, the fourth differentially coupled transistor pair and the first transistor are all pnp transistors.

25. The quadrature mixer circuit according to claim 18 wherein the first differentially coupled transistor pair, the second differentially coupled transistor pair, the third differentially coupled transistor pair, the fourth differentially coupled transistor pair and the first transistor are all MOSFET transistors.

26. The quadrature mixer circuit according to claim 18 wherein the first differentially coupled transistor pair, the second differentially coupled transistor pair, the third differentially coupled transistor pair, the fourth differentially coupled transistor pair and the first transistor are all MESFET transistors.

27. The quadrature mixer circuit as in claim 18 wherein the folded cascode circuit comprises:
- a first cascode transistor having an emitter terminal coupled to a second terminal of a first capacitor and to a first terminal of a first inductor, a collector terminal coupled to the second differentially coupled transistor pair and a base terminal,
- a second cascode transistor having a base terminal coupled to the base terminal of the first cascode transistor, an emitter terminal coupled to a first terminal of a second inductor and to the emitter terminal of the first transistor and a collector terminal coupled to the first differentially coupled transistor pair,
- a first resistor having a first terminal coupled to the second terminal of the first cascode capacitor and the first terminal of the first cascode capacitor and a second terminal coupled to a first bias voltage,
- a second resistor having a first terminal coupled to the first bias voltage and to the second terminal of the first resistor and having a second terminal,
- a third cascode transistor having a collector terminal coupled to the fourth differentially coupled transistor pair, an emitter terminal coupled to the first terminal of the first inductor and to the emitter terminal of the first cascode transistor, and a base terminal,
- a fourth cascode transistor having a base terminal coupled to the base terminal of the third cascode transistor, a collector terminal coupled the third differentially coupled transistor pair and an emitter terminal coupled to the emitter terminal of the second cascode transistor and to the first terminal of the second inductor,
- a third cascode capacitor having a first terminal coupled to the emitter terminal of the third cascode transistor and a second terminal coupled to the base terminal of the third and fourth cascode transistors,
- a fourth cascode capacitor having a first terminal coupled to the second terminal of the third cascode capacitor and to the base terminals of the third and fourth cascode transistors and a second terminal coupled to the emitter terminal of the fourth cascode transistor.

28. The quadrature mixer circuit as in claim 27 wherein the low noise RF input circuit further includes a RF feedback circuit, the RF feedback circuit comprising:
- a second transistor having a base terminal coupled to a supply potential, an emitter terminal coupled to the collector terminal of the first transistor and a collector terminal coupled to a first terminal of the supply resistor and to a first terminal of the first capacitor,
- a feedback resistor, having a first terminal coupled to a base terminal of the first input transistor and a second terminal, a second capacitor, having a first terminal coupled to the second terminal of the feedback resistor and a second terminal coupled to the first terminal of the supply resistor.

29. The quadrature mixer circuit as in claim 28, wherein the mixer core further includes a first tracking supply circuit portion coupled to In-Phase LO drive input terminals of the mixer core and a second tracking supply circuit portion coupled to Quadrature Phase LO drive input terminals of the mixer core.

30. The quadrature mixer circuit as in claim 29, wherein the first tracking supply circuit portion comprises:
   a. a first diode-connected transistor having a cathode terminal coupled to a ground potential and an anode terminal;
   b. a second diode-connected transistor having a cathode terminal coupled to the anode terminal of the first diode connected transistor and an anode terminal,
   c. a third resistor having a first terminal coupled to the anode terminal of the second diode connected transistor and a second terminal;
   d. a first current supply having a first terminal coupled to the second terminal of the third resistor and a second terminal coupled to the supply potential;
   e. a loop amplifier having a first terminal coupled to the second terminal of the third resistor and to the first terminal of the first current supply, a second terminal coupled to the supply potential, a third terminal coupled to the ground potential and a fourth terminal;
   f. a fourth resistor having a first terminal coupled to the fourth terminal of the loop amplifier and a second terminal;
   g. a third transistor having a collector terminal coupled to the second terminal of the fourth resistor, a base terminal coupled to receive a first LO drive signal and an emitter terminal;
   h. a fourth transistor having a base terminal coupled to receive a second LO drive signal, an emitter terminal coupled to the emitter terminal of the third transistor and a collector terminal;
   i. a fifth resistor having a first terminal coupled to the fourth terminal of the loop amplifier and a second terminal coupled to the collector terminal of the fourth transistor;
   j. a second current supply having a first terminal coupled to the emitter terminal of the third transistor and to the emitter terminal of the fourth transistor and a second terminal coupled to the ground potential;
   k. a first common collector amplifier having a base terminal coupled to the second terminal of the fifth resistor and to the collector terminal of the fourth transistor, a collector terminal coupled to the fourth terminal of the loop amplifier, and an emitter terminal coupled to a first mixer core LO input;
   l. a third current supply having a first terminal coupled to the emitter terminal of the first common collector amplifier and a second terminal coupled to the ground potential;
   m. a second common collector amplifier having a base terminal coupled to the second terminal of the fifth resistor and to the collector terminal of the third transistor, a collector terminal coupled to the fourth terminal of the loop amplifier and an emitter terminal coupled to a second mixer core LO input; and
   n. a fourth current supply having a first terminal coupled to the emitter terminal of the second common collector amplifier and a second terminal coupled to the ground potential;

and wherein the second tracking supply circuit portion comprises:
   o. a third diode-connected transistor having a cathode terminal coupled to the ground potential and an anode terminal;
   p. a fourth diode-connected transistor having a cathode terminal coupled to the anode terminal of the third diode connected transistor and an anode terminal;
   q. a sixth resistor having a first terminal coupled to the anode terminal of the second diode connected transistor and a second terminal;
   r. a fifth current supply having a first terminal coupled to the second terminal of the sixth resistor and a second terminal coupled to the supply potential;
   s. a second loop amplifier having a first terminal coupled to the second terminal of the sixth resistor and to the first terminal of the fifth current supply, a second terminal coupled to the supply potential, a third terminal coupled to the ground potential and a fourth terminal;
   t. a seventh resistor having a first terminal coupled to the fourth terminal of the second loop amplifier and a second terminal;
   u. a fourth transistor having a collector terminal coupled to the second terminal of the seventh resistor, a base terminal coupled to receive a first LO drive signal and emitter terminal;
   v. a fourth transistor having a base terminal coupled to receive a second LO drive signal, an emitter terminal coupled to the emitter terminal of the fourth transistor and a collector terminal;
   w. a eighth resistor having a first terminal coupled to the fourth terminal of the second loop amplifier and a second terminal coupled to the collector terminal of the fourth transistor;
   x. a sixth current supply having a first terminal coupled to the emitter terminal of the fourth transistor and to the emitter terminal of the fourth transistor and a second terminal coupled to the ground potential;
   y. a third common collector amplifier having a base terminal coupled to the second terminal of the eighth resistor and to the collector terminal of the fourth transistor, a collector terminal coupled to the fourth terminal of the second loop amplifier, and an emitter terminal coupled to a first mixer core LO input;
   z. a seventh current supply having a first terminal coupled to the emitter terminal of the third common collector amplifier and a second terminal coupled to the ground potential;
   aa. a fourth common collector amplifier having a base terminal coupled to the second terminal of the seventh resistor and to the collector terminal of the fourth transistor, a collector terminal coupled to the fourth terminal of the second loop amplifier and an emitter terminal coupled to a second mixer core LO input;
   ab. a eighth current supply having a first terminal coupled to the emitter terminal of the fourth common collector amplifier and a second terminal coupled to the ground potential.

31. The quadrature mixer circuit as in claim 27, wherein the low noise RF input circuit further includes a tracking mixer bias current circuit, the tracking bias current circuit comprising:

a first resistor having a first terminal coupled to the supply potential and a second terminal, a first diode connected transistor having a anode terminal coupled to the second terminal of the third resistor and a cathode terminal, a second transistor having a collector terminal coupled to the cathode terminal of the first diode connected transistor, an emitter terminal coupled to the ground potential and a base terminal, a loop amplifier having a first terminal coupled to the emitter terminal of the first diode connected transistor and to the collector terminal of the second transistor, a second terminal coupled to the first bias voltage and a third terminal, a second resistor having a first terminal coupled to the base terminal of the second transistor and a second terminal coupled to the second terminal of the loop amplifier and to the first bias voltage, a bandgap voltage supply having a first terminal coupled to the ground potential and a second terminal coupled to the third terminal of the loop amplifier.

32. A mixer circuit for generating an IF output responsive to an RF input and a LO drive source, comprising:

a mixer core having a doubly balanced mixer including a first differentially coupled transistor pair and a second differentially coupled transistor pair, the mixer core coupled to receive a LO drive signal, the LO drive signal having a plurality of harmonics;

a low noise single ended RF input circuit coupled to the mixer core through a cascode circuit, the low noise single ended RF input circuit coupled to receive an RF input signal, wherein the cascode circuit further isolates the low noise single ended RF input circuit from the LO drive signal and the plurality of harmonics, the low noise single ended RF circuit including means for providing an input impedance and means for splitting a phase of the RF input signal.

33. The mixer circuit according to claim 32 wherein the first differentially coupled transistor pair and the second differentially coupled transistor pair are all npn transistors.

34. The mixer circuit according to claim 32 wherein the first differentially coupled transistor pair and the second differentially coupled transistor pair are all pnp transistors.

35. The mixer circuit according to claim 32 wherein the first differentially coupled transistor pair and the second differentially coupled transistor pair are all MOSFET transistors.

36. The mixer circuit according to claim 32 wherein the first differentially coupled transistor pair and the second differentially coupled transistor pair are all MESFET transistors.

* * * * *